United States Patent [19]
Cole, Jr. et al.

[11] Patent Number: 5,745,984
[45] Date of Patent: May 5, 1998

[54] METHOD FOR MAKING AN ELECTRONIC MODULE

[75] Inventors: Herbert Stanley Cole, Jr., Burnt Hills; Theresa Ann Sitnik-Nieters, Clifton Park, both of N.Y.

[73] Assignee: Martin Marietta Corporation, Bethesda, Md.

[21] Appl. No.: 500,671

[22] Filed: Jul. 10, 1995

[51] Int. Cl.$^6$ .................................................. H05K 3/32
[52] U.S. Cl. ........................... 29/834; 29/841; 29/847; 29/851; 29/852; 174/259; 174/260; 257/700; 428/901; 437/209
[58] Field of Search .......................... 29/830, 834, 840, 29/841, 847, 851, 852; 257/700; 174/259, 260; 427/96; 428/901; 437/209

[56] References Cited

U.S. PATENT DOCUMENTS

| | | | |
|---|---|---|---|
| 4,783,695 | 11/1988 | Eichelberger et al. | 257/700 X |
| 5,108,825 | 4/1992 | Wojnerowski et al. | 428/901 X |
| 5,169,678 | 12/1992 | Cole et al. | 427/96 X |
| 5,255,431 | 10/1993 | Burdick | 29/830 X |
| 5,353,498 | 10/1994 | Fillion et al. | 437/209 X |
| 5,388,328 | 2/1995 | Yokono et al. | 29/852 |
| 5,546,654 | 8/1996 | Wojnarowski et al. | 29/841 |
| 5,564,181 | 10/1996 | Dineen et al. | 29/841 |

OTHER PUBLICATIONS

Multilayer Thin Film Hybrids on Silicon — R. Wayne Johnson et al. ISHM Proceedings — Seattle, Oct. '88.
Benzocyclobutene as a Dielectric for Multichip Module Fabrication — M.J.Berry et al. ECTC Proceedings — Las Vegas, May 1990.
Advances in MCM Fabrication with Benzocyclobutene Dielectric — R.H.Heistand II, et al — ISHM Proceedings, Orlando — Oct. 1991.
Benzocyclobutenes: A New Class of High Performance Polymers — R.A.Kirchhoff et al — J.Macromol.Sci.–Chem.,A28,pp. 1079–1113 ('91).
Curing and Glass Transition Behavior of a Benzocyclobutene Polymer–H.E.Bair et al — Soc.Plastics Engrs.Proc. — Montreal 1991.
Thermosetting Resins for High Density Interconnects — J.N.Carr. Dow Chemical USA, Midland, Michigan. Hybrid Circuit Technology — p. 25, Aug. 1990.
High Frequency Transmission Properties of Al–BCB and Cu–BCB Si Multi Chip Modules — H.Hesselbom et al — ISHM Proceedings, San Francisco, Oct. '92.
Processing and Microwave Characterization of Multilevel interconnects Using Benzocyclobutene Dielectric –P.B. Chinoy et al. IEEE Transactions on Components, etc.–vol. 16, #7, Nov. 1993.
Cost Implications of Large Area MCM Processing — D.C.Frye et al.
An Integrated Millimeterwave BCB Patch Antenna HEMT Receiver — U.Dahlgren et al.

*Primary Examiner*—Peter Vo
*Attorney, Agent, or Firm*—Brian J. Rees; Geoffrey H. Krauss

[57] ABSTRACT

A multi-chip module is provided which utilizes benzocyclobutene as a laminate adhesive for bonding the upper dielectric films in a high density interconnect structure. The benzocyclobutene thermosetting polymer is spin coated on a polyimide film, and baked at low temperature to remove any solvent to leave a B-staged coating on the polyimide film. The composite film can be laminated to an underlying electrical structure using a vacuum laminator and heat. As the heat is applied, the BCB layer softens, flows and then cures to bond the polyimide film to the underlying electrical structure.

8 Claims, 1 Drawing Sheet

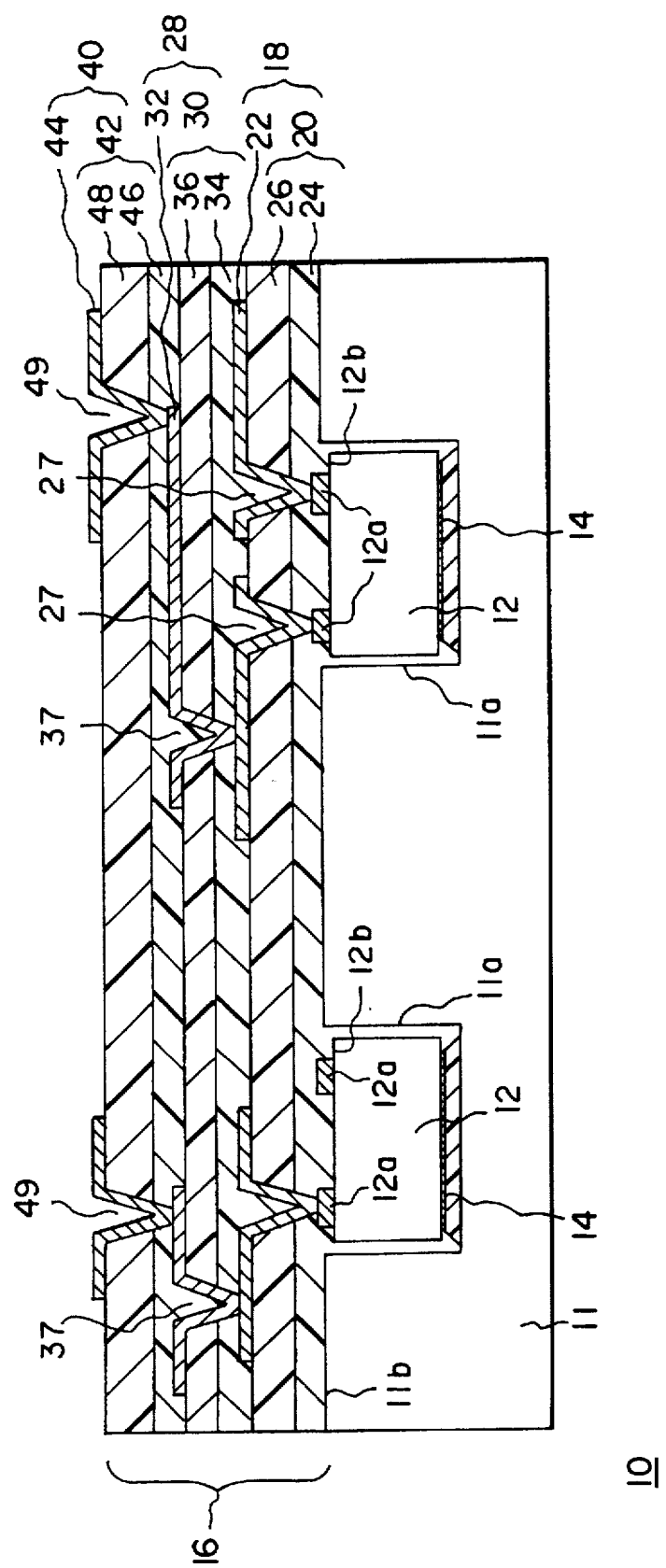

METHOD FOR MAKING AN ELECTRONIC MODULE

The present invention relates to an improved dielectric adhesive material and, more particularly, to the use of benzocyclobutene polymer as a laminate adhesive in the construction of the high density interconnect structure of a multi-chip module.

BACKGROUND OF THE INVENTION

A high density interconnect (HDI) structure offers many advantages in the compact assembly of electronic systems. For example, a multi-chip electronic system (such as a microcomputer incorporating 30–50 chips) can be fully assembled and interconnected by a suitable HDI structure on a single substrate, to form a unitary package which is 2 inches long by 2 inches wide by 0.050 inches thick. Even more important, the interconnect structure can be disassembled from the substrate for repair or replacement of a faulty component and then reassembled without significant risk to the good components incorporated within the system. This is particularly important where many (e.g., 50) chips, each being very costly, may be incorporated in a single system on one substrate. This repairability feature is a substantial advance over prior connection systems in which reworking the system to replace damaged components was either impossible or involved substantial risk to the good components.

Briefly, in this high density interconnect structure, a ceramic substrate such as alumina which may be 50–100 mils thick and of appropriate size and strength for the overall system, is provided. This size is typically less than 2 inches square, but may be made larger or smaller. Once the position of the various chips has been specified, individual cavities or one large cavity having appropriate depth at the intended locations of differing chips, is prepared. This may be done by starting with a bare substrate having a uniform thickness and the desired size. Conventional, ultrasonic or laser milling may be used to form the cavities in which the various chips and other components will be positioned. For many systems where it is desired to place chips nearly edge-to-edge, a single large cavity is satisfactory. That large cavity may typically have a uniform depth where the semiconductor chips have a substantially uniform thickness. The cavity bottom may be made respectively deeper or shallower at a location where a particularly thick or thin component will be placed, so that the upper surface of the corresponding component is in substantially the same plane as the upper surface of the rest of the components and the portion of the substrate which surrounds the cavity. The bottom of the cavity is then provided with a thermoplastic adhesive layer, which may preferably be a polyetherimide resin (such as "ULTEM®" 6000 resin, available from the General Electric Company, Fairfield, Conn.), or an adhesive composition described in U.S. Pat. No. 5,270,371, herein incorporated in its entirety by reference. The various components are then placed in their desired locations within the cavity and the entire structure is heated to remove solvent and thermoplastically bond the individual components to the substrate.

Thereafter, a film (which may be "KAPTON®" polyimide, available from E.I. du Pont de Nemours Company, Wilmington, Del.), of a thickness of approximately 0.0005–0.003 inches (approx. 12.5–75 microns), is pre-treated by reactive ion etching (RIE) to promote adhesion. The substrate and chips must then be coated with "ULTEM®" 1000 polyetherimide resin or another thermoplastic adhesive to adhere the "KAPTON®" resin film when it is laminated across the top of the chips, any other components and the substrate. Thereafter, via holes are provided (preferably by laser drilling) through the "KAPTON®" resin film, and "ULTEM®" resin layers, at locations in alignment with the contact pads on the electronic components to which it is desired to make contact. A metallization multi-layer, with a first layer comprising titanium and a second layer comprising copper, is deposited over the "KAPTON®" resin layer and extends into the via holes to make electrical contact to the contact pads disposed thereunder. This metallization layer may be patterned to form individual conductors during the deposition process or may be deposited as a continuous layer and then patterned using photoresist and etching. The photoresist is preferably exposed using a laser to provide an accurately aligned conductor pattern at the end of the process. Alternatively, exposure through a mask may be used.

Any additional dielectric layers for isolation between the first metallization layer and any subsequent metallization layers may be added by spinning on or spraying on a solvent solution of a desired dielectric adhesive material onto a thermosetting dielectric layer. Presently a siloxane polyimide/epoxy (SPIE) blend adhesive is used as an adhesive to bond additional layers of "KAPTON®". Since dielectric materials are used both in adhesive and in dielectric layers, there are special requirements placed on the system. In particular, in order for the final structure to be suitable over a wide temperature range, the dielectric layers (including the adhesives) must have high melting points and high thermal stability. Any candidate layer must provide good adhesion to the underlying dielectric and metallization and to overlying dielectric layer, and should also be inherently laser ablatable or should be rendered laser ablatable in accordance with U.S. Pat. No. 5,169,678 entitled, "Laser Ablatable Polymer dielectrics and Methods." Any misposition of the individual electronic components and their contact pads is compensated for by an adaptive laser lithography system which is the subject of some of the patents and applications listed hereinafter.

The process of designing an interconnection pattern for interconnecting all of the chips and components of an electronic system on a single high density interconnect substrate normally takes somewhere between one week and five weeks. Once an interconnect structure has been defined, assembly of the system on the substrate and the overlay structure is built-up on top of the chips and substrate, one layer at a time. Typically, the entire process can be finished in less than one day, as described in U.S. Pat. No. 5,214,655, entitled "Integrated Circuit Packaging Configuration for Rapid Customized Design and Unique test Capability" by C. W. Eichelberger, et al., herein incorporated in its entirety by reference. Consequently, this high density interconnect structure not only results in a substantially lighter weight and more compact package for an electronic system, but enables a prototype of the system to be fabricated and tested in a much shorter time than is required with other packaging techniques.

This high density interconnect structure, methods of fabricating it and tools for fabricating it are disclosed in U.S. Pat. No. 4,783,695, entitled "Multichip Integrated Circuit Packaging Configuration and Method" by C. W. Eichelberger, et al.; U.S. Pat. No. 5,127,998, entitled "Area-Selective Metallization Process" by H. S. Cole et al.; U.S. Pat. No. 5,127,844, entitled "Area-Selective Metallization Process" by H. S. Cole, et al.; U.S. Pat. No. 5,169,678, entitled "Locally Orientation Specific Routing System" by T. R. Hailer, et al.; U.S. Pat. No. 5,108,825, entitled "An Epoxy/Polyimide Copolymer Blend Dielectric and Layered Circuits Incorporating It" by C. W. Eichelberger, et al.; and U.S. Pat. Ser. No. 08/239,785, "High Density Interconnect Structures Incorporating An Improved Dielectric Material and Method of Fabrication", by H. S. Cole, et al now abandoned. Each of these Patents and Patent Applications, including the references contained therein, is hereby incorporated herein in its entirety by reference.

Benzocyclobutene (BCB) is a polymeric material offered by Dow Chemical Co. (Midland, Mich.), for use in the electronic packaging industry. A significant amount of work has been done to characterize BCB as a dielectric material for use in a multi-chip module. For example, BCB has a dielectric constant of 2.7, a dissipation factor at 1 MHZ of 0.0008, and a glass transition temperature greater than 350° C. There are presently over 100 publications describing the synthesis, polymer characterization, method of fabrication of MCMs using BCB and the electrical performance of devices fabricated with this polymer. In all of the work reported in the literature, however, BCB is used as a complete (stand alone) dielectric layer and is applied by spin or spray coating. Although BCB has adequate planarization properties, because it is spin or spray coated, there is not complete planarization of the polymer layer that is covering a device or other object.

Also, the use of MCMs for high frequency, microwave, and millimeter wave applications are gaining increasing popularity because both the size of the module and the parasitic losses in that module decrease as the frequency at which the module operates increases. As such, the interconnection of structures or devices intended to operate at extremely high frequencies presents many challenges not faced in the interconnection of digital systems. For example, at gigahertz (GHz) frequencies, the electrical performance can be improved with thicker dielectrics (on the order of 35-65 microns) which are difficult to obtain using spray or spin techniques; these GHz frequencies also require consideration of wave characteristics, transmission line effects and material properties.

As with any electronic module, there are losses inherent when passing current through a conductor. In a multi-chip module, these losses come from both the plurality of metal layers, as well as the dielectric layers supporting and separating the metal layers. As the application frequency increases, the losses associated with the dielectric layers begin to dominate. For the related art HDI multi-layer interconnect structures which utilize a lamination method for applying the dielectric layers, adhesive layers are used to bond one dielectric layer to another. Therefore, both the dielectric layer and the adhesive layer contribute to the high frequency dielectric loss, and the dielectric properties of the adhesive layer are as important as that of the dielectric layer. The choice of the adhesive layer to be used for multi-layer interconnect applications is dictated by a compromise between process compatibility and electrical characteristics. Therefore, in addition to the traditional requirements that the adhesive: have good adhesion to polymers and metal; have the ability to planarize; have good optical absorption properties for laser via drilling; and have adequate reliability over a wide temperature range, when used for high frequency applications, it is equally important that the adhesive have adequate electrical properties.

Consequently, it is desirable to provide a dielectric material with better electrical characteristics for use as a laminate adhesive in a high density interconnect structure.

OBJECTS OF THE INVENTION

Accordingly, a primary object of the present invention is to provide a high density interconnect laminate adhesive, having improved electrical performance, while maintaining adequate processing properties.

SUMMARY OF THE INVENTION

The above and other objects, which will become apparent from the specification as a whole, including the drawings, are accomplished in accordance with the present invention by using benzocyclobutene (BCB) as a laminate adhesive in a HDI multi-chip module. BCB is deposited on a polyimide film and baked at low temperature to remove any solvent to leave a B-staged BCB coating on the polyimide. The composite film can be laminated to underlying electrical structures using a vacuum laminator and heat. As the heat is applied, the BCB layer softens, flows and then cures to form a void-free bond between the polyimide film and the underlying structure.

BRIEF DESCRIPTION OF THE SOLE DRAWING

The subject matter which is regarded as the invention is particularly pointed out and distinctly claimed in the concluding portion of the specification. The invention, together with further objects and advantages thereof, may best be understood by reference to the following description taken in connection with the sole accompanying drawing, which is a cross-sectional view of a multichip module incorporating a high density interconnect structure having BCB as the laminate adhesive in the upper dielectric layers.

DETAILED DESCRIPTION

Referring to the sole FIGURE, a multichip module 10 has a substrate 11 with a plurality of chip cavities 11a formed therein, through a top surface 11b thereof. An integrated circuit chip 12 or another electronic component is disposed in each chipwell 11a. Electronic components 12 may be bonded to the substrate 11 with a layer of a thermoplastic adhesive 14; these electronic components 12 have contact pads 12a on an upper contact surface 12b thereof A high density interconnect structure 16 is fabricated above the chips 12 on the substrate upper surface 11b.

A first stratum 18 of the overlying high density interconnect structure 16 comprises a dielectric layer 20 supporting a patterned metallization layer 22. The dielectric layer 20 has separate lower and upper sublayers 24 and 26, respectively, and supports the patterned metallization layer 22 which extends into contact with contact pads 12a on the device 12 through via holes 27 in the dielectric layer. The lower dielectric sublayer 24 is a thermoplastic adhesive having a first glass transition temperature $T_{g1}$. Preferably, lower sublayer 24 is a thermoplastic polyetherimide, such as "ULTEM 1000" resin, available from The General Electric Co. (Pittsfield, Mass.), which is modified with a plasticizer. Although BCB (described in detail hereinbelow) could be used as sublayer 24, it is not the preferred material because it is thermosetting and as such does not allow removal of upper layer 26 without potentially damaging chips 12. When a thermoplastic material is used for sublayer 24, all that need be done is to heat the layer to a temperature above its $T_g$ at which point the thermoplastic material would soften, and allow upper sublayer 26 to be peeled away.

The upper dielectric sublayer 26 may be a thermoplastic material having a higher $T_g$, but is preferably a thermoset material. Where the components or chips 12 are bonded to the substrate with a thermoplastic chip adhesive 14, it is preferred that the chip adhesive have a glass transition temperature ($T_g$) which is higher than $T_{g1}$.

The upper sublayer 26 of the first dielectric layer 20 should be stable over a range of temperatures above $T_{g1}$, for stability during lamination to the chips in the fabrication process. By stable, we mean the upper sublayer 26 must have sufficient viscosity that it does not shift, stretch or otherwise change in an undesirable manner during the lamination step. This upper sublayer 26 is preferably a thermoset film (for example, a "KAPTON®" film). Other materials, including thermoplastics which exhibit sufficient stability, may also be used.

A second stratum 28 of the high density interconnect structure comprises a second dielectric layer 30 supporting a second patterned metallization layer 32. The dielectric layer 30 has separate lower and upper sublayers 34 and 36, respectively. Via holes 37 are drilled and another patterned metallization sublayer 32 extends into via holes 37 in the dielectric layer 30 to make contact with the first metallization layer 22. If desired, selected via holes may extend through the first dielectric layer 20 as well to provide direct contact to selected contact pads 12a. Once adhesive 34, a thermosetting material, is laminated (cured) the $T_g$ increases, and creates a temperature and solvent resistant second stratum.

In accordance with the present invention, benzocyclobutene (BCB) can be incorporated into a high density interconnect structure, as a laminate adhesive 34, by spin coating a solution of approximately 57% BCB in mesitylene (available in solution from Dow Chemical Company, Midland Mich.) onto layer 36. After lower sublayer 34 is deposited onto upper sublayer 36, the composite structure is baked at low temperature to remove the solvent and leave a tack-free film 34 of BCB uniformly coated and B-staged onto a "KAPTON®" polyimide film 36. The term B-staged is well known in the art and refers to the state in which a polymer is coated and baked but can be resolvented; the polymer has not had its final thermal- or photo-cure to render the polymer insoluble. Using standard HDI processing techniques, the composite structure is laminated over first stratum 18 under heat and pressure sufficient to allow the BCB adhesive sublayer 34 to soften, flow, and then cure to uniformly bond upper sublayer 36 to first stratum 18. BCB has a high glass transition temperature after final cure, i.e., greater than 350° C., and also has very good mechanical toughness and low moisture uptake. When the high density interconnected multi-chip module is utilized for high frequency applications, the advantages of BCB become even more apparent.

As stated above, the use of MCM technology provides the reduction in size and parasitics necessary for high frequency applications, e.g., phased array radar systems. One of the parasitics that is important in high frequency/microwave applications is transmission line losses which are comprised of conductor and dielectric losses. The conductor losses are proportional to the square root of the frequency and depend on the conductivity of the metal. The dielectric losses are proportional linearly with frequency and depend on the loss tangent of the dielectric. As the loss tangent of the dielectric is increases, the electrical signal is more easily dissipated, thus resulting in a poor signal to noise ratio. At high frequencies, the dielectric losses usually dominate the conductor losses because of its linear proportionality to frequency. In order to fabricate integral passive components in HDI, the loss tangent of the dielectric must be low in order to minimize the total losses at these high frequencies. Even in high speed digital applications, clock edge acuity can be improved using low loss dielectrics because of reduced alteration to the higher frequency components which will exist for faster clock edges in the time domain.

Table 1 shows the loss tangent properties for several polymer dielectrics utilized in HDI applications. As can be seen from the table, "KAPTON E®" polyimide has the lowest loss tangent value, followed by plasticized "ULTEM", with BCB having the next lowest value. One would think, then, that "KAPTON E®" polyimide should be utilized for all dielectric layers; however, since polyimides have inherently poor adhesion as a laminate, this is not practical. Also, since the plasticized "ULTEM" is a thermoplastic, it is only useful for use as the first layer lamination adhesive (to keep open the option of repairability). Although BCB could be utilized as a stand-alone dielectric layer, it is difficult to spin a coating of BCB thicker than about 15–20 microns. However, in high frequency applications, e.g., gigahertz, it is necessary that the dielectric layers have thicknesses of at least 30 microns or thicker, and that the thickness of the entire layer be extremely uniform. The combination of thickness and uniformity is difficult to accomplish with spin-coated upper layers because the metallized vias fabricated in the first dielectric layer are approximately 50 microns in diameter at the top and extend to a depth of approximately 30 microns. Even multiple coats applied by spin or spray will not result in complete via planarization and dielectric uniformity. Moreover, since the metallization lines are designed with 50 ohm impedance, the dielectric must be uniform or signal losses will result from de-tuning of the signal through the varying dielectric thickness. Therefore, without utilizing BCB as a laminate adhesive it would not be presently practical to use BCB as a dielectric layer for extremely high frequency applications. Furthermore, the combination of "KAPTON E®" polyimide with a BCB laminate adhesive provides superior electrical properties and further provides a dielectric layer which is thick enough for high frequency applications.

TABLE 1

| MATERIAL | DIELECTRIC CONSTANT (1 MHz) | LOSS TANGENT (10 GHz–20 GHz) |
|---|---|---|
| KAPTONE E ® polyimide | 3.2 | 0.0020–0.0025 |
| Plasticized "ULTEM ®" | 3.0 | 0.0030–0.0035 |
| SPIE | 3.0 | 0.0180–0.0200 |
| BCB | 2.7 | 0.0050–0.0055 |

Another advantage to the "KAPTON E®" polyimide/BCB combination is that laminating a polymer with a flowable adhesive provides a dielectric layer with superior planarization properties. Spin coating, on the other hand, has difficulty maintaining a planar dielectric surface. This is especially true when the surface to which the dielectric is being spin coated has components placed thereon. Utilizing a lamination method, for example, "KAPTON E®" polyimide/BCB, the pressure being applied to the "KAPTON E®" polyimide exerts a pressure onto the adhesive (BCB) and when heat is applied to the lamination process, the BCB is forced into the crevices between the components and the via holes resulting in complete planarization of the dielectric layer, and the metal layer supported thereon. A planarized dielectric layer (and metal layer) results in improved signal-to-noise ratio at high frequencies because the signal lines can be accurately made with a uniform 50 ohm impedance. Non-uniform dielectric layers cause a variable signal impedance due to the changing thickness of the underlying dielectric layer and its associated capacitance changes.

Referring again to the sole FIGURE, the third stratum 40 of the high density interconnect structure comprises a third dielectric layer 42 supporting a third patterned metallization layer 44. Dielectric layer 42 has separate lower and upper sublayers 46 and 48, respectively. Third lower dielectric sublayer 46 is again preferably a BCB thermosetting adhesive. The third upper dielectric sublayer 48 may again be a thermoset material or a thermoplastic material and is preferably a thermoset material, such as "KAPTON®" film. Lamination of this third stratum 40 may be followed by via drilling which extends vias 49 through the dielectric layer 42 such that the patterned metallization layer 44 will connect to the metal layer 32 of the second stratum 28.

Additional (fourth, fifth, etc.) strata of the high density interconnect structure are not shown in the sole FIGURE, but, if used, could be (HDI) essentially identical to the upper strata 28 and 40. Each additional upper stratum would comprise a dielectric layer having a thermosetting BCB adhesive and having via holes therein, and a patterned metallization layer making contact with the patterned metallization of the next lower patterned metallization layer through the via holes. Other strata can be added in accordance with the above description.

At this point the module is complete; various metallization layers 22, 32, 44 will carry power, ground, and at least one set of signal conductors.

The following illustrative examples are not intended to limit the scope of this invention but to illustrate its application and use:

EXAMPLE 1

We have demonstrated that benzocyclobutene can be used as a laminate adhesive by first coating BCB on a suitable film material, baking the polymer to B-stage, and then laminating the BCB-film combination over the desired structure. Specifically, the BCB polymer is supplied as a 57% solution in mesitylene. This solvent has a boiling point of about 162° C. and can be conveniently removed by baking at about that temperature. A 1 mil film of "KAPTON E®" polyimide is mounted securely on an 8 inch frame. The frame is placed on a spin coater and the BCB solution dispensed and spun at about 2,000 RPM to uniformly coat the BCB onto the polyimide film. After spinning for 30 seconds, the frame is baked for ½ hr at 100° C. and ½ hr at 150° C. A tack-free and B-staged film of BCB (having a thickness of about 12 microns) being disposed on the "KAPTON E®" polyimide film is now ready for lamination.

Integrated circuit chips were bonded in chip wells on an alumina substrate to act as the electrical components for this experiment. The chips and substrate were placed in a vacuum laminator and the "KAPTON E®" polyimide/BCB composite film was placed over the substrate with the BCB side down. The laminator was then evacuated and, after 15 minutes, 10 psi of nitrogen was applied to the top side of the polyimide film. The temperature was then ramped up to 190° C. and held at that temperature for 1 hour. As the temperature was raised in the laminator, the BCB flowed, bonded and then cured to form the adherent bond between the substrate and the polyimide film. Pull tests on samples laminated in a similar manner showed the adhesion was in excess of 7 lbs/in$^2$. The temperature was then lowered to room temperature and the sample was removed. After this cycle, the bond between the polyimide film and the ceramic substrate and chips was substantially uniform, planar and void-free.

After lamination, vias were formed by laser drilling using an argon ion laser system. The part was then ashed, and thin layers of titanium and copper were sputtered onto the polyimide. Then, a layer of several (4) microns of copper was electroplated and a final top layer of titanium was sputtered. The sputtered titanium layers were about 1,000 angstroms and the sputtered copper was about 3,000 angstroms. Photoresist was applied, exposed, developed (using standard photolithographic techniques) and the metal was etched to form a metal interconnect structure. The part was electrically tested and found to be 100 percent electrically interconnected. The part was given 100 cycles from −65° C. to +150° C., with no change in electrical interconnect integrity.

EXAMPLE 2

We have demonstrated that the adhesion of "KAPTON®" polyimide films to substrates with BCB as a laminate adhesive is dependent on the lamination time and temperature. For these bond tests, the "KAPTON®" polyimide film was given a standard oxygen RIE treatment and was coated with a thin layer of adhesion promoter before the BCB polymer was spin coated from a commercially available solution. The structure was then baked for ½ hour at 100° C., and for ½ hr at 150° C. to leave a 12 micron thick film. From the results of these tests, shown in Table 2, the minimum time and temperature for good adhesion of the polyimide to other materials was shown to be dependent on temperature and time.

TABLE 2

| Sample | Lamination Time and Temperature | Bond Test Result |
| --- | --- | --- |
| 1 | 190° C. for 90 minutes | poor adhesion |
| 2 | 195° C. for 90 minutes | >7 lbs/in$^2$, KAPTON breaks |
| 3 | 200° C. for 90 minutes | >7 lbs/in$^2$, KAPTON breaks |
| 4 | 210° C. for 90 minutes | >7 lbs/in$^2$, KAPTON breaks |
| 5 | 190° C. for 120 minutes | >7 lbs/in$^2$, KAPTON breaks |

To provide adequate bonding, the temperature should be at least 190° C., and the dwell time at this temperature should be at least 2 hours. However, at higher temperatures, shorter dwell times could be used. For example, a lamination at 230° C. gave good adhesion after only a 30 minute lamination. Conversely, much longer times at temperatures below 190° C. may also be utilized.

EXAMPLE 3

Illustratively, benzocyclobutene can be used as a laminate adhesive by coating BCB on a suitable film material, baking the polymer to B-stage, and then laminating over the desired structure. Specifically, the BCB polymer is supplied as a 57% solution in mesitylene. A 1 mil thick film of "KAPTON E®" polyimide is mounted securely on an 8 inch frame. The frame is cleaned and coated with a silane coupling agent prior to being coated with the adhesive. The frame is placed on a spin coater and the BCB solution dispensed and spun to produce a 12 micron thick adhesive layer (after baking). The baking cycle is 15 minutes at 100° C. followed by 1 hour at 180° C. Laminations are completed using a Carver press modified to deliver pressure and vacuum. "KAPTON®" polyimide sheets are placed on the bottom tray with slits to provide vacuum. The samples are placed face up in the center of the tray, and the frame (with the BCB adhesive) is placed face down onto the sample. The "lamination stack" is completed with a 5 mil piece of polyimide and a 2 mil piece of polyimide placed on top. After the system is closed, top vacuum is turned on for 10 minutes and then the bottom vacuum is turned on, which ensures removal of all the air previously showing up as voids in the via holes. After 1 hour, the top vacuum is turned off and a top pressure of 40 psi is applied. The temperature is heated from 150° C. to 190° C. where it is maintained for 3 hours to provide adequate adhesion. The samples are then submitted to a water boil test which is accomplished by submersing the fabricated samples in hot water (85°–95° C.) for 24 hours. After removal and drying, the samples are tested for adhesion. The pull strength (even after the water boil test) is greater than 7 lbs/in$^2$.

While the invention has been described in detail herein in accordance with certain preferred embodiments thereof, many modifications and changes therein may be effected by those skilled in the art. Accordingly, it is our intent to be limited only by the scope of the appending claims and not by way of the details and instrumentalities describing the embodiments shown herein.

What is claimed is:

1. A method for making an electronic circuit module, comprising the steps of:

disposing a plurality of electronic chips on a substrate, the chips including contact pads;

adhesively laminating a first thermoset polymer film layer, over the chips and areas of the substrate surface surrounding the chips, with a thermoplastic adhesive;

providing a plurality of via openings over at least some of the contact pads in the first polymer film/adhesive layer;

providing a first pattern of electrical conductors on the first film layer so that conductors extend between the via openings so as to electrically connect selected contact pads;

adhesively laminating at least one additional polymer film over at least a portion of each of the first polymer film layer and the first electrical conductor pattern, with a benzocyclobutene polymer adhesive;

providing a plurality of additional via openings in each additional polymer/benzocyclobutene polymer film, the openings being disposed over at least some of electrical conductors of an associated next lower layer; and providing an additional pattern of electrical conductors on each of the at least one additional polymer film so that conductors extend into the associated via openings so as to electrically connect with some of the electrical conductors of the associated next lower layer.

2. The method of claim 1, where the step of disposing a plurality of electronic chips on a substrate surface further includes the step of forming chipwells in the substrate surface and disposing the chips into the chipwells, and where the first polymer film is polyimide, and further where the step of adhesively laminating the first polymer film further comprises the steps of applying a thermoplastic adhesive to the polyimide film, placing the polyimide/adhesive composite onto the substrate and applying heat and pressure sufficient to cause the thermoplastic adhesive to flow and bond to the substrate.

3. The method of claim 2, where the thermoplastic adhesive is a plasticized polyetherimide.

4. The method of claim 2, where each of the at least one additional polymer film is polyimide, and where the step of adhesively laminating each of the at least one additional polymer film further comprises the steps of applying a layer of benzocyclobutene polymer adhesive to each respective polymer film, placing the polyimide/benzocyclobutene composite onto an associated lower layer and applying heat and pressure sufficient to cause the thermosetting adhesive to flow and bond the additional polymer film to the associated lower layer.

5. The method of claim 4, where, prior to lamination, the benzocyclobutene polymer adhesive for each of the at least one additional polymer film is in a B-staged state.

6. The method of claim 5, where the step of adhesively laminating each of the at least one additional polymer film occurs at a temperature of at least 190° C. and a pressure of at least 5 psi and is held at this temperature and pressure for at least 2 hours.

7. The method of claim 5, where the step of adhesively laminating each of the at least one additional polymer film occurs at a temperature of at least 200° C. and a pressure of at least 5 psi and is held at this temperature and pressure for at least 90 minutes.

8. The method of claim 5, where the step of adhesively laminating each of the additional polymer films occurs at a temperature of at least 230° C. and a pressure of at least 5 psi and is held at this temperature and pressure for at least 30 minutes.

* * * * *